US006806168B2

(12) United States Patent
Towle et al.

(10) Patent No.: US 6,806,168 B2
(45) Date of Patent: Oct. 19, 2004

(54) HEALING OF MICRO-CRACKS IN AN ON-CHIP DIELECTRIC

(75) Inventors: Steven N. Towle, Phoenix, AZ (US); Anna M. George, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/306,357

(22) Filed: Nov. 27, 2002

(65) Prior Publication Data

US 2004/0099877 A1 May 27, 2004

(51) Int. Cl.$^7$ ............................................... H01L 21/46
(52) U.S. Cl. ........................................ 438/460; 438/465
(58) Field of Search ................................. 438/460, 461, 438/462, 463, 464, 465

(56) References Cited

U.S. PATENT DOCUMENTS

| | | | | |
|---|---|---|---|---|
| 5,818,111 A | * | 10/1998 | Jeng et al. | 257/776 |
| 5,834,829 A | * | 11/1998 | Dinkel et al. | 438/462 |
| 6,190,947 B1 | * | 2/2001 | Tai et al. | 438/460 |
| 6,207,554 B1 | * | 3/2001 | Xu et al. | 438/624 |
| 6,271,102 B1 | * | 8/2001 | Brouillette et al. | 438/462 |
| 6,291,317 B1 | * | 9/2001 | Salatino et al. | 438/462 |
| 6,294,439 B1 | * | 9/2001 | Sasaki et al. | 438/464 |
| 6,534,386 B2 | * | 3/2003 | Irie | 438/464 |

* cited by examiner

Primary Examiner—Kevin M. Picardat
(74) Attorney, Agent, or Firm—Blakely, Sokoloff, Taylor & Zafman LLP

(57) ABSTRACT

In one embodiment there is provided a method comprising performing a singulation operation on a wafer; and treating the wafer to at least reduce a propagation of micro-cracks formed in the wafer during the singulation. In another embodiment there is provided a semi-conductor die comprising a substrate having a central first portion, and a peripheral second portion around the central first portion; an integrated circuit formed on the central first portion; and a guard ring disposed between the first and second portions of the substrate to prevent a propagation of micro-cracks formed in the second portion into the first portion, the micro-cracks having been formed during a singulation operation to separate the semiconductor die from a wafer, wherein the second portion includes micro-cracks filled with a crack-healing material to arrest propagation of the micro-cracks beyond the ring and into the central first portion.

15 Claims, 5 Drawing Sheets

HEALING OF MICRO-CRACKS IN AN ON-CHIP DIELECTRIC

FIELD OF THE INVENTION

This invention relates to integrated circuit packaging. In particular, it relates to a method for preventing damage to a semiconductor wafer during die singulation.

BACKGROUND

Microcircuits may be fabricated on a substrate of a semiconductor material (e.g., silicon) which is usually called a wafer. Each wafer generally comprises a rectangular array of identical microcircuits. After fabrication, each microcircuit and the portion of the substrate on which it is formed (called a die or chip) is separated from the rest of the wafer. This process is called singulation and may be achieved by sawing through the wafer using, e.g., a diamond-tipped saw.

Once the microcircuits have been singulated, they may be packaged for use in electronic devices.

During die sawing, the wafer is subjected to mechanical stresses which may cause microscopic micro-cracks to be formed in a resultant die.

Over a period of time, these micro-cracks may cause parts of the die-substrate to disintegrate or flake off and may cause the integrated circuit on the die to be become damaged.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
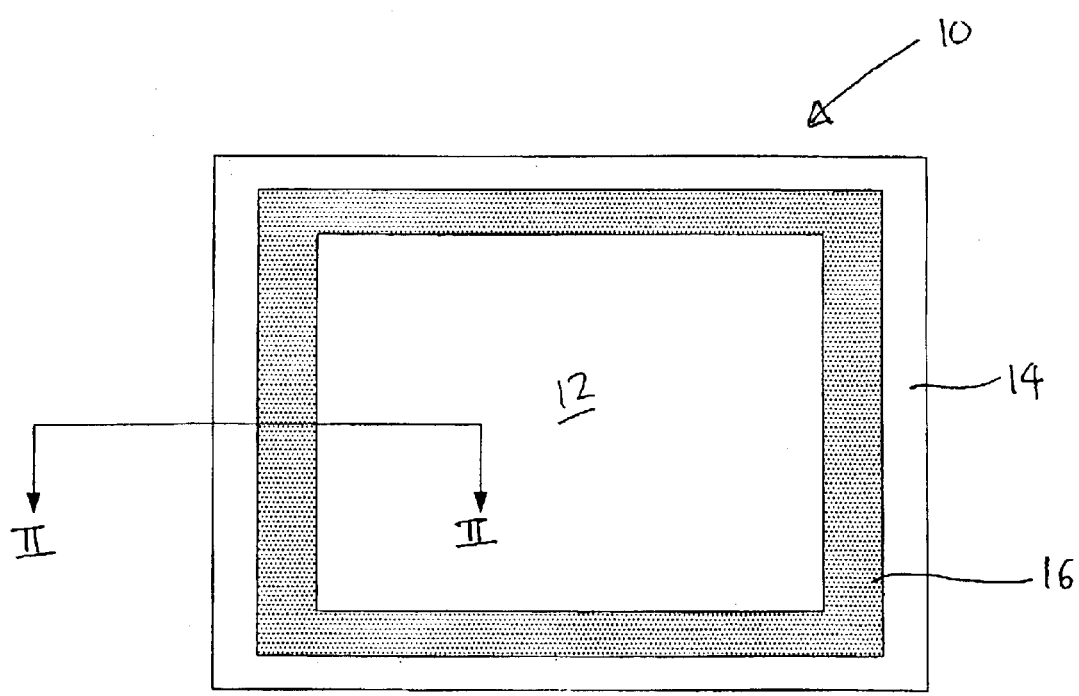
FIG. 1 shows a top plan view of a semiconductor die in accordance with one embodiment of the invention.
Figure 2:
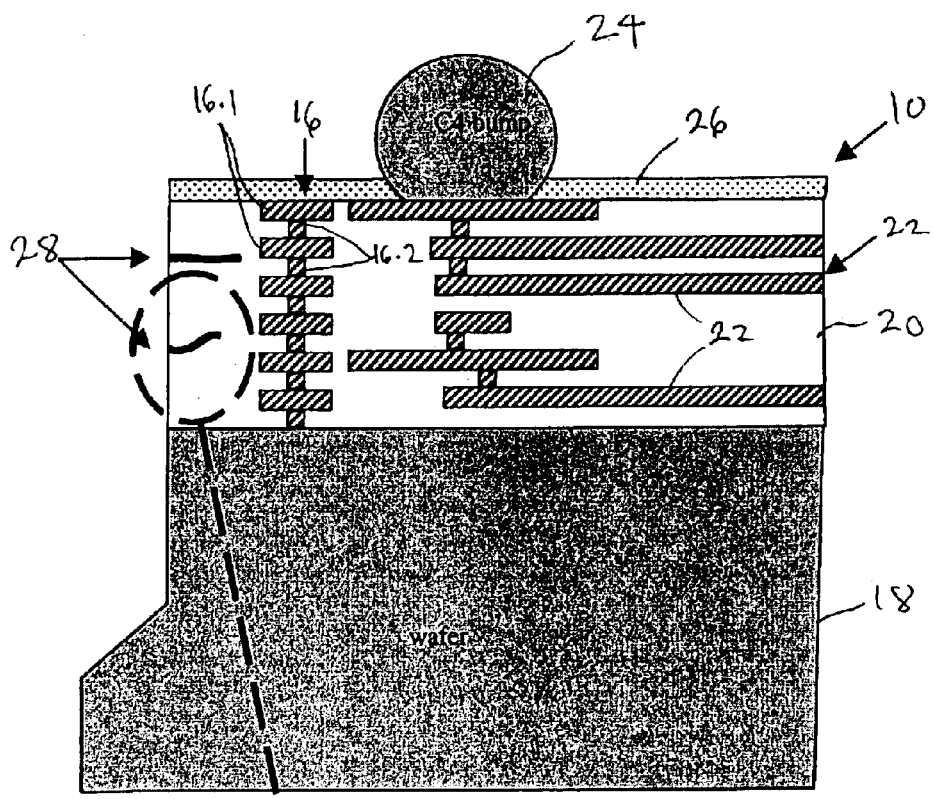
FIG. 2 shows a cross-section of the die of FIG. 1 taken at II—II.

Referring now to FIGS. 1 and 2 of the drawings, reference numeral 10 generally indicates a semiconductor die. FIG. 1 shows a top plan view of the semiconductor die 10, whereas FIG. 2 shows a cross-section of the die 10 taken at II—II in FIG. 1 of the drawings. As can be seen from FIG. 1, the semiconductor die 10 includes a central region 12 which is separated from a peripheral region 14 by a guard ring 16. The central region 12 constitutes an active area of the die 10 and includes one or more microcircuits (not shown). The guard ring 16 forms a continuous ring around the central region 12 and protects the active die area from damage, as will be explained in greater detail below.

Referring now to FIG. 2 of the drawings, it will be seen that the semiconductor die 10 comprises a silicon substrate 18, which is generally known in the art as a "wafer". The semiconductor die further includes dielectric and metal layers formed on the silicon substrate 18. In order not to obscure the invention, the dielectric layers are represented as a single dielectric layer indicated by reference numeral 20. However, one skilled in the art will understand that the single dielectric layer 20 comprises a plurality of dielectric layers. The metal layers are indicated by reference numeral 22 and together define an interconnection structure which is connected to an interconnect mechanism, e.g., to controlled collapse chip connect (C4) bumps. In order not to obscure the invention, only one C4 bump 24 is shown. The semiconductor die 10 includes a surface layer 26 which may be of a polyimide material.

As will be seen from FIG. 2 of the drawings, the guard ring 16 comprises several layers of metal indicated by reference numeral 16.1 which are interconnected by vias indicated by reference numeral 16.2.

The deposition of the dielectric layers 20, the interconnect metal layers 22, the guard ring metal layers 16.1 and the formation of the vias 16.2 is performed using well known processes such as photolithography, patterning, etching, etc. Generally, the structure for several dies are simultaneously deposited on a wafer. Thereafter, each die is separated from the wafer in a process called die singulation.

Figure 3:
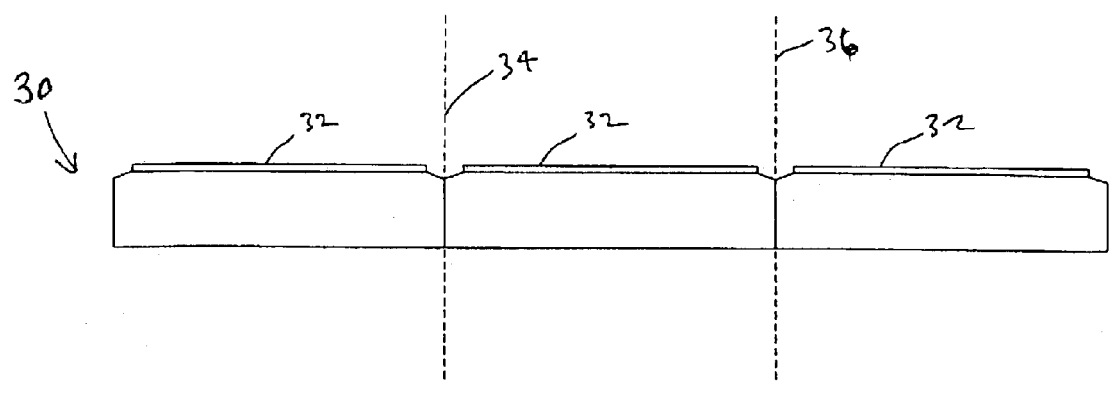
FIG. 3 of the drawings illustrates the process of die singulation.

FIG. 3 of the drawings shows a wafer 30 on which microcircuits 32 have been deposited. During die singulation, individual dies are separated along singulation lines 34 and 36. One technique for achieving the separation is to saw through the wafer 30 along the singulation lines 34 and 36. Due to the sawing process, the region surrounding the singulation lines 34 and 36 are subjected to mechanical stresses which cause the formation of micro-cracks in the dielectric material of each resultant die.

Figure 4:
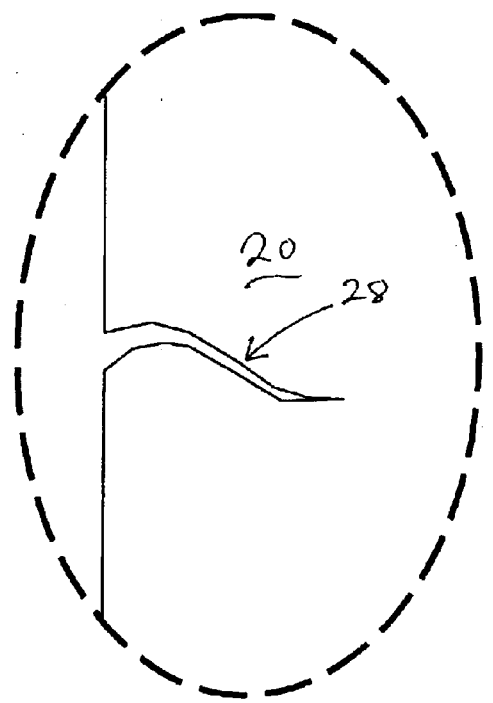
FIG. 4 shows a micro-crack in the interlayer the dielectric of the die of FIGS. 1 and 2, in greater detail.

Examples of these micro-cracks are indicated by reference numeral 28 in FIG. 2 of the drawings. An enlarged view of a micro-crack 28 is shown in FIG. 4 of the drawings. One purpose of the guard ring 16 is to prevent the micro-cracks 28 from propagating into the central region 12 of the die, which is the active area of the die.

The ability of the guard ring 16 in preventing the propagation of the micro-cracks 28 into the central region 12 is dependent on the actual composition of the dielectric material used to form the dielectric layers 20. It has been found that certain materials with a low dielectric constant in the range of 1.0–3.5 are especially susceptible to micro-cracks forming therein. Such micro-cracks may initially be relatively short and lie outside the guard ring 16, but during further assembly processing and reliability testing or under use conditions, these micro-cracks propagate into the central area 12, causing failure of the die. Examples of materials with low dielectric constants which exhibit this behavior include chemical vapor deposition (CVD) carbon-doped oxide (CDO), spin-on-glass materials, and porous ultra low dielectric constant materials such as aerogels, xerogels, other porous $SiO_2$-based materials, porous hydrosilsesquioxane (HSQ), porous methylsilsesquioxane (MSQ), and porous CVD CDO, among others.

It is desirable to use the dielectric materials of low dielectric constants to form the dielectric layers 20 since materials of a low dielectric constant allow the microcircuits of a die to be operated at a greater speed. However, it has been found that existing guard rings do not prevent the propagation of micro-cracks into the active area of a die in the case of the die having dielectric layers of a low dielectric constant material.

In one embodiment, each micro-crack 28 is filled with a material which draws edges of the micro-crack together, thus "healing" the micro-crack and preventing the further propagation thereof.

Figure 5:
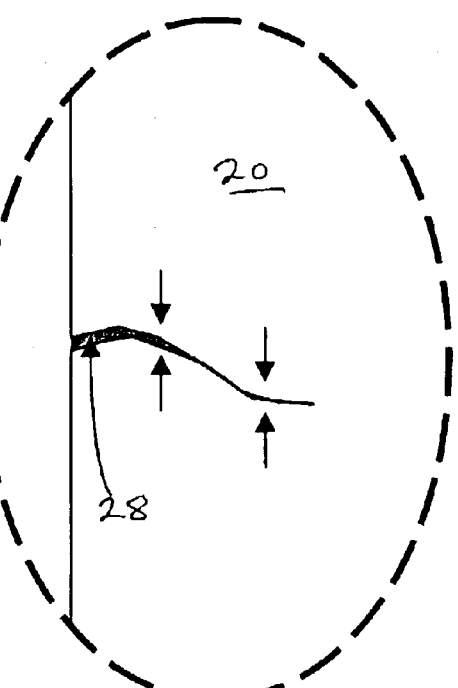
FIG. 5 shows the micro-crack of FIG. 3 after it has been filled in accordance with the techniques disclosed herein.

FIG. 5 of the drawings shows an example of a micro-crack 28 which has been filled with a crack-healing material that tends to close the micro-crack. For example, in one embodiment, a spin-on-glass material may be used to fill each micro-crack 28. This material is suitable since it tends to draw opposed edges of the micro-crack together due to the crack-healing material's intrinsic tensile stress. Also, spin-on-glass materials show strong wetting of many of the low-dielectric-constant and ultra-low-dielectric-constant materials cited above. Strong wetting creates a driving force for the material to be drawn into the crack (i.e., capillary action), thereby facilitating the filling process.

Figure 6:
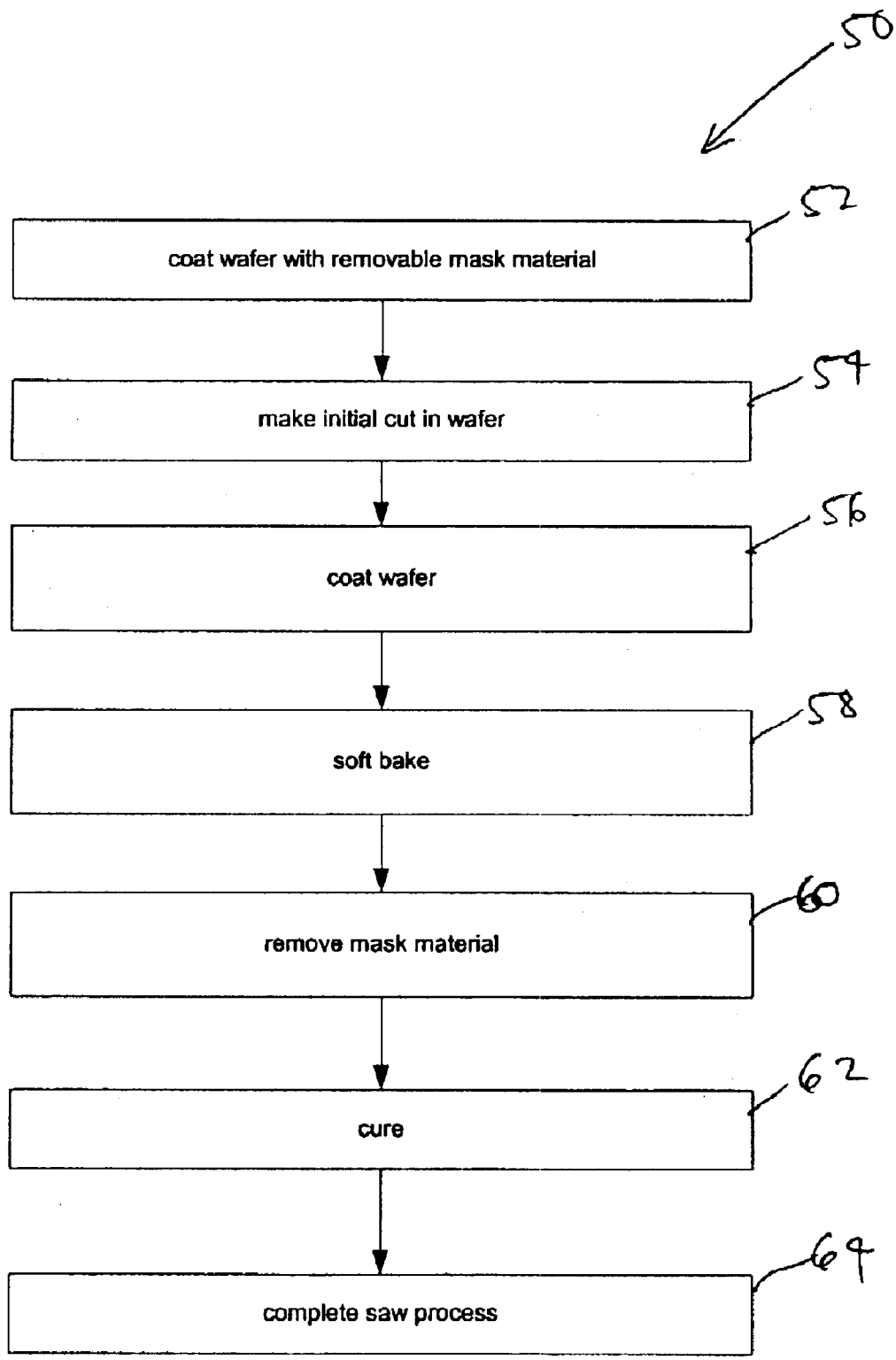
FIG. 6 illustrates a process for healing a micro-crack in accordance with one embodiment of the invention.

Referring now to FIG. 6 of the drawings, reference numeral 50 generally indicates a process, in accordance with one embodiment, for filling the micro-cracks 28. Referring to FIG. 6, at block 52, the wafer 30 is coated with a removable mask material, such as a photoresist material or a removable adhesive tape material. Some such materials may require a soft bake to remove solvents.

The purpose of coating the wafer 30 with a removable mask material is to prevent interconnects on the wafer from coming into contact with the crack-healing material. Thus, referring to die 10, the removable mask material is applied over the C4 bumps to prevent the C4 bumps from being coated by the crack-healing material. Thereafter at block 54, an initial cut is made in the wafer 30 where the wafer is to be singulated, i.e., along singulation lines 34 and 36 of FIG. 3 of the drawings. At block 56, the wafer 30 is coated with a material which penetrates each micro-crack. In one embodiment, this material may be a spin-on-glass material, an HSQ-type material, or an MSQ-type material. Examples of such materials include ACCUGLASS™ and ACCU-FLO™ materials from Honeywell Electronic Materials. Other suppliers of spin-on-glass materials include: Dow Corning Corporation, Midland, Mich., United States; Filmtronics, Butler, Pa., United States; Futurrex, Inc., Franklin, N.J., United States; Gelest, Inc., Tullytown, Pa., United State Labs, Santa Clara, Calif., United states. The coating at block 56 may be achieved by dipping the wafer in a bath of the crack-healing material, by spray-coating the crack-healing material, or by other methods.

After coating the wafer at block 56, the wafer is subjected to a soft bake operation at block 58, in order to cause solvents in the crack-healing material to evaporate. The time-temperature profile of this soft-bake step may be optimized to allow maximal penetration of the crack-healing material into the crack, e.g. by including a holding period at an intermediate temperature during the ramp up to the soft-bake temperature.

At block 60, the mask material is removed, and at block 62, the wafer is subjected to a hard baking process in order to cure the crack-healing material. The final volume of the crack-healing material is controlled by the time-temperature profile of the hard and soft bake steps, allowing for optimization of the stress in the system to pull the edges of the crack together and prevent further crack propagation. At block 64, the saw process is completed, which includes sawing completely through the wafer along, e.g., lines 34 and 36.

As noted above, spin-on-glass materials, MSQ and HSQ-type materials may be used as crack-healing materials. However, other materials that have a tendency to fill and close a high aspect ratio, narrow opening by capillary action may be used. An example of such a material is ACCUGLASS™ T-14 supplied by Honeywell Corporation, Morristown, N.J., United States. In some embodiments, the crack-healing material may be comprised of a spin-on-glass precursor with relatively low molecular weight (200–50000), in order to allow more rapid diffusion into a narrow crack. In other embodiments, the crack-healing material may be formulated to selectively wet only the dielectric material but not the interconnect formations, e.g., bumps of the die. In this case there would be no need to mask the bumps.

In another case, the coating step may be performed under vacuum, to prevent air in the micro-cracks from blocking the flow of crack-healing material into the micro-cracks. In yet other cases, after coating the wafer 30 at block 56 with the crack-healing material, a vacuum operation may be performed to remove air pockets form each micro-crack.

Figure 7:
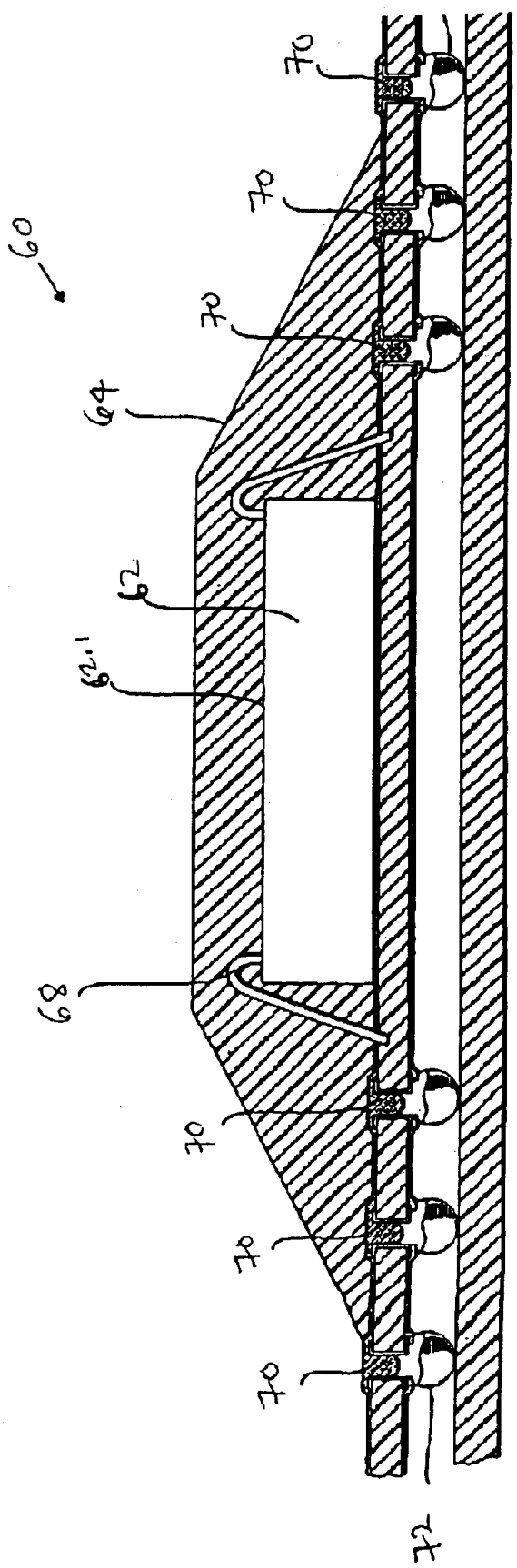
FIG. 7 shows an electronic device in accordance with one embodiment of the invention.

Referring now to FIG. 7 of the drawings, there is shown a cross-section through an electronic device 60, in accordance with one embodiment of the invention. The electronic device 60 includes a die 62, which is similar to the die 10, which is housed within a semiconductor package 64. The die 62 has an upper surface 62.1 on which a microcircuit is formed. Package 64 is mounted to a substrate 66. Electrical connection between the die 12 and the substrate 66 is achieved through bonding wires 68 which are electrically connected to bonding pads 70, which in turn are electrically connected to solder balls 72 through vias in the substrate 14. In other embodiments electrical interconnection between the die 12 and the substrate 66 may be achieved using flip-chip technology. The die 62 includes micro-cracks that have been filled with a crack-healing material in accordance with the techniques disclosed above.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method, comprising:
   performing a singulation operation on a wafer;
   treating the wafer to at least reduce a propagation of micro-cracks formed in the wafer during the singulation; wherein the treating comprises filling each micro-crack with a crack-healing material.

2. The method of claim 1, wherein the crack-healing material applies a compressive stress to opposed surfaces of each micro-crack.

3. The method of claim 1, wherein the treating occurs under a vacuum.

4. The method of claim 1, wherein the singulation process comprises sawing the wafer.

5. The method of claim 1, wherein the crack-healing material comprises a spin-on-glass material.

6. The method of claim 1, wherein the crack-healing material comprises a siloxane-based polymer.

7. The method of claim 1, wherein the crack-healing material comprises a HSQ-type material.

8. The method of claim 1, wherein the crack-healing material comprises a MSQ-type material.

9. The method of claim 4, wherein the sawing operation comprises two stages.

10. The method of claim 9, wherein during a first stage of the two stage sawing operation, a cut is made through an interconnect structure formed on a substrate material of the wafer and part of the wafer, and during a second stage of the two stage sawing operation, a cut is made through a remainder of the substrate material.

11. The method of claim 9, wherein the treating is performed after the first stage, but before the second stage.

12. The method of claim 11, further comprising first coating the wafer with a removable mask material.

13. The method of claim 12, wherein the treating-comprises coating the wafer with the crack-healing material after completion of the first stage; soft baking the wafer, removing the mask material, and curing the crack-healing material.

14. The method of claim 12, wherein the treating further comprises removing air pockets from the micro-cracks after the coating.

15. The method of claim 1, wherein the crack-healing material selectively wets only a dielectric material of the wafer, and not interconnect formations on the wafer.

* * * * *